US009461108B2

(12) United States Patent
Konstantinov

(10) Patent No.: US 9,461,108 B2
(45) Date of Patent: Oct. 4, 2016

(54) SIC POWER DEVICE HAVING A HIGH VOLTAGE TERMINATION

(71) Applicant: FAIRCHILD SEMICONDUCTOR CORPORATION, San Jose, CA (US)

(72) Inventor: Andrei Konstantinov, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/750,655

(22) Filed: Jun. 25, 2015

(65) Prior Publication Data

US 2016/0049465 A1 Feb. 18, 2016

Related U.S. Application Data

(60) Provisional application No. 62/036,925, filed on Aug. 13, 2014.

(51) Int. Cl.

| | |
|---|---|
| ***H01L 29/15*** | (2006.01) |
| ***H01L 29/06*** | (2006.01) |
| ***H01L 29/16*** | (2006.01) |
| ***H01L 29/10*** | (2006.01) |
| ***H01L 29/861*** | (2006.01) |
| ***H01L 29/78*** | (2006.01) |
| ***H01L 29/66*** | (2006.01) |
| ***H01L 29/872*** | (2006.01) |
| *H01L 29/732* | (2006.01) |

(52) U.S. Cl.

CPC ....... *H01L 29/0615* (2013.01); *H01L 29/0619* (2013.01); *H01L 29/0661* (2013.01); *H01L 29/1095* (2013.01); *H01L 29/1608* (2013.01); *H01L 29/6606* (2013.01); *H01L 29/7811* (2013.01); *H01L 29/861* (2013.01); *H01L 29/872* (2013.01); *H01L 29/732* (2013.01)

(58) Field of Classification Search

CPC .................................................. H01L 29/1608

See application file for complete search history.

(56) References Cited

U.S. PATENT DOCUMENTS

| | | | | |
|---|---|---|---|---|
| 4,242,690 | A | 12/1980 | Temple | |
| 5,712,502 | A | 1/1998 | Mitlehner et al. | |
| 6,002,159 | A | 12/1999 | Bakowski et al. | |
| 6,005,261 | A | 12/1999 | Konstantinov | |
| 6,573,534 | B1 * | 6/2003 | Kumar | H01L 29/1608 257/328 |
| 6,972,436 | B2 * | 12/2005 | Das | H01L 21/045 257/411 |

OTHER PUBLICATIONS

Ghandi et al., "High-voltage 4H-SiC PiN diodes with Etched Junction Termination Extension", IEEE Electron Device Letters, vol. 30, No. 11, 2009, pp. 1170-1172.

Paques et al., "High-Voltage 4H-SiC Thyristors With a Graded Etched Junction Termination Extension", IEEE Electron Device Letters, vol. 32, No. 10, Oct. 2011, pp. 1421-1423.

(Continued)

*Primary Examiner* — Nicholas Tobergte

(74) *Attorney, Agent, or Firm* — Brake Hughes Bellermann LLP

(57) ABSTRACT

In one general aspect, an apparatus can include a semiconductor region including a silicon carbide material and a junction termination extension implant region disposed in the semiconductor region. The apparatus can include a low interface state density portion of a dielectric layer having at least a portion in contact with the junction termination extension implant region.

19 Claims, 13 Drawing Sheets

(56) References Cited

OTHER PUBLICATIONS

Rupp et al., "Avalanche Behaviour and its Temperature Dependence of Commercial SiC MPS Diodes: Influence of Design and Voltage Class", International Symposium on Power Semiconductor Devices & IC's , Jun. 2014, pp. 67-70.

Stengl et al., "Variation of Lateral Doping—A New Concept to Avoid High Voltage Breakdown of Planar Junctions", International Electron Devices Meeting, 1985, pp. 154-157.

Temple, Victor A. K, "Increased Avalanche Breakdown Voltage and Controlled Surface Electric Fields Using a Junction Termination Extension (JTE) Technique", IEEE Transactions on Electron Devices, vol. ED-30, No. 8, Aug. 1983, pp. 954-957.

* cited by examiner

SIC POWER DEVICE HAVING A HIGH VOLTAGE TERMINATION

RELATED APPLICATION

This application claims priority to and the benefit of U.S. Provisional Application No. 62/036,925, filed Aug. 13, 2014, entitled, "SIC POWER DEVICE HAVING A HIGH VOLTAGE TERMINATION," which is incorporated herein by reference in its entirety.

TECHNICAL FIELD

This description relates to a silicon carbide (SiC) power device having a high voltage termination.

BACKGROUND

Known high voltage power devices in silicon carbide (SiC) are vulnerable to premature breakdown around a device periphery. The breakdown voltage at device periphery can be lower than the avalanche breakdown voltage in the bulk of the device. Known solutions for termination regions do not provide sufficient process stability or can consume relatively large chip areas. Known solutions for termination of high voltage SiC power device do not yield uniform avalanche breakdown in the bulk of SiC. Also, known solutions for high voltage termination of power devices do not eliminate early breakdown at device periphery.

SUMMARY

In one general aspect, an apparatus can include a semiconductor region including a silicon carbide material and a junction termination extension implant region disposed in the semiconductor region. The apparatus can include a low interface state density portion of a dielectric layer having at least a portion in contact with the junction termination extension implant region.

The details of one or more implementations are set forth in the accompanying drawings and the description below. Other features will be apparent from the description and drawings, and from the claims.

DETAILED DESCRIPTION

Figure 1:
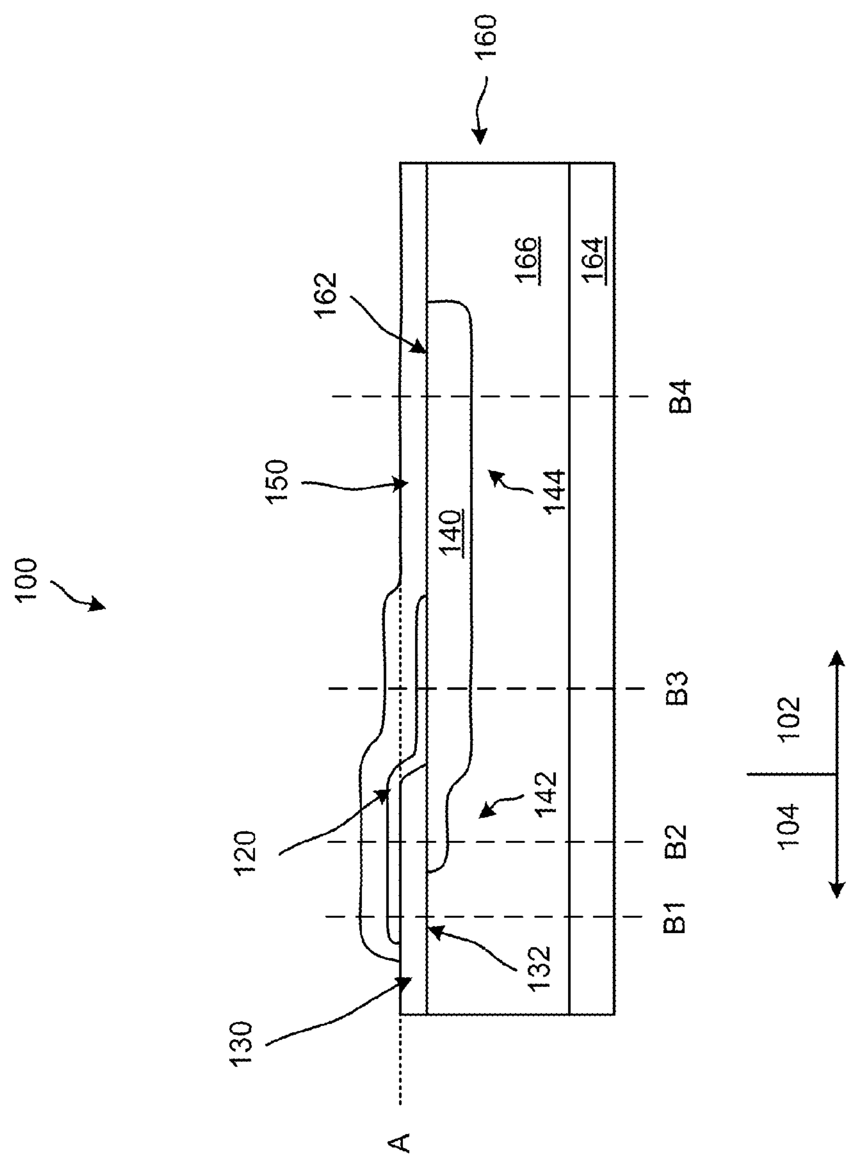
FIG. 1 is a diagram that illustrates a side cross-sectional view of a silicon carbide (SiC) power device.

FIG. 1 is a diagram that illustrates a side cross-sectional view of a silicon carbide high voltage high power device 100 (which can be referred to as a SiC power device or as a SiC high voltage device) that utilizes an ion-implanted junction termination extension (which can be referred to as a junction termination extension (JTE) implant 140) in a termination region 102. The termination region 102 (which is toward the right in the figure) can be disposed around (e.g., can surround) an active region 104 (which is toward the left (in a lateral direction) in the figure). When viewed from the above (not shown), the termination region 102 can be disposed around an outer region of the SiC power device 100 and can be disposed around (e.g., can surround) the active region 104, which can be disposed within an interior region of the SiC power device 100.

To define the termination region 102, at least some acceptor charge at the outer periphery of a semiconductor region 160 of the SiC power device 100 is removed to define (e.g., expose) a surface 162. The surface 162 is vertically disposed at a depth within the semiconductor region 160 that is lower than an interior portion (toward the left) of the semiconductor region 160 including the active region 104 (which is illustrated by the dashed line A (also can be referred to as plane A)). Specifically, at least some acceptor charge within the termination region 102 is partially removed by etching (e.g., an ion etch) of a topmost layer of the semiconductor region 160 (from the surface illustrated by the dashed line A). During processing, the surface 162 is an exposed surface of the semiconductor region 160 that has been recessed below line or plane A (which can be an original surface of the semiconductor region 160 before being recessed). The surface 162 of the semiconductor region 160 is within, or defines, a recessed region or recessed area.

As shown in FIG. 1, the inner part of the termination region 102 (and the surface 162 of the semiconductor region 160 that is exposed) is coated with a dielectric layer 150 (or coating) having a portion 120 with a low interface state density. In other words, the dielectric layer 150 is disposed on the surface 162 of the semiconductor region 160. This portion can be referred to as a low interface state portion 120 (also can be referred to as a low interface state density portion or as a low interface state layer) or as a low interface state dielectric. In some implementations, the low interface state portion 120 can be made of a material of gate oxide quality (e.g., can have the interface state density low enough to ensure the possibility of forming an inversion and/or accumulation channel). In some implementations, the low interface state portion 120 can include oxygen, nitrogen, and/or combinations thereof (e.g., oxygen ($O_2$), an oxynitride, nitrogen oxide (NOx), nitrous oxide ($N_2O$)). In some implementations, the low interface state portion 120 can include an oxide-nitride-oxide (ONO) stack.

As noted above, the low interface state portion 120 can be a portion of the dielectric layer 150. Although not labeled, portions of the dielectric layer 150 outside of the low interface state density portion 120 can be referred to as a high interface state density portion. Accordingly, throughout the description, references to the dielectric layer 150 can be considered as references to the high interface state density portion of the dielectric layer 150. An interface is defined by the juxtaposition of the low interface state density portion 120 with the dielectric layer 150. In some implementations, the low interface state density portion 120 can be separate from the dielectric layer 150. In some implementations, the low interface state density portion 120 can be formed from the dielectric layer 150 or can be a dielectric layer formed separate from (e.g., during a separate dielectric formation process from) the dielectric layer 150.

As shown in FIG. 1, the low interface state portion 120 is in contact with a top surface of the JTE implant 140. In some implementations, the low interface state portion 120 has a bottom surface in contact with the surface 162 (which can be a top surface) of the JTE implant 140. In other words, the low interface state portion 120 defines an interface with the JTE implant 140.

In some implementations, the JTE implant 140 can be implanted before the surface 162 of the semiconductor region 160 is defined. In some implementations, the JTE implant 140 can be implanted after the surface 162 of the semiconductor region 160 is defined.

In some implementations, the semiconductor region 160 can include a substrate portion 164 (e.g., an N+ substrate) and a voltage blocking layer 166 (e.g., an N-type voltage blocking layer). In some implementations, the voltage blocking layer 166 can define, or can include, a drift region. The semiconductor region 160 can include a doped region 130 (e.g., a P+ region) or well region. The doped region 130 can be associated with, or included within, the active region 104. In some implementations, the doped region 130 can have a doping concentration of between approximately 1e17 $cm^{-3}$ and 1e19 $cm^{-3}$. The doping concentration (e.g., peak doping concentration) of JTE implant 140 can be between approximately 5e17 $cm^{-3}$ and 2e18 $cm^{-3}$. An edge of the dope region 130 can be aligned with (e.g., vertically aligned with) the active region 104 and the termination region 102.

The doped region 130 can have a conductivity type different than a conductivity type of the blocking layer 166. The JTE implant 140 can have a conductivity type that is the same as the conductivity type of the doped region 130. The substrate portion 164 can have a conductivity type that is the same as a conductivity type of the blocking layer 166.

In some implementations, the active region 104 of the device 100 shown in FIG. 1 can be an epitaxial PN diode, which can be formed by deposition of an epitaxial p-type layer 130 (which can be referred to as a mesa) with subsequent p-layer removal along the device periphery. The termination region 102 can, in some implementations, partially overlap the active region 104 so as to avoid gaps between the active region 104 and the termination region 102.

As shown in FIG. 1, the low interface state portion 120 has or includes a first portion aligned along or disposed on top of a surface (along line or plane A) of the semiconductor region 160 and has or includes a second portion disposed within the recessed region that is recessed below the semiconductor region 160. In other words, the second portion is disposed on the surface 162. In some implementations, the dielectric layer 150 (or high interface state portion of the dielectric layer 150) is disposed on the low interface state portion 120 such that a first portion of the low interface state portion 120 is disposed between the dielectric layer 150 (or high interface state portion of the dielectric layer 150) and the doped region 130 and a second portion of the low interface state portion 120 is disposed between the dielectric layer 150 and the JTE implant 140.

In some implementations, the low interface state portion 120 can be disposed around an edge of a diode anode (or PN junction) defined by, for example, the doped region 130 and the voltage blocking layer 166. The diode anode (or PN junction) is illustrated at PN interface 132. In some implementations, the low interface state portion 120 can be a low interface-state density oxide. In some implementations, the low interface state portion 120 can, for example, be a deposited oxide (of the dielectric layer 150 (e.g., a nitrided oxide) that is at least partially converted to an oxynitride by annealing in $N_2O$ (e.g., or NO) ambient at, for example, 1100° C. to 1300° C. For example, the lower interface state portion 120 can include an oxide-nitride-oxide (ONO) stack. In some implementations, the low interface state portion 120 can be a phosphorus doped oxide. In some implementations, the low interface state portion 120 can be, or can include, any combination of the above-identified materials. Interface density reduction in SiC can also be employed. In some implementations the diode 100 can be peripheral portion (or in the termination region 102) of a MOSFET, of a NPN-type BJT, and/or of a junction-blocked Schottky diode (JBS). In other words, an active device such as a MOSFET, a NPN-type BJT, a JBS, and/or so forth can be disposed in the active region 104. Examples of such devices are described in connection with at least FIGS. 12 through 14.

In some implementations, the thickness of the low interface state portion 120 can approximately between 10 nanometers (nm) to 200 nm. In some implementations, the thickness of the low interface state portion 120 can approximately between 20 nm to 50 nm. The thickness of the dielectric layer 150 (which can be a passivation dielectric) can be approximately between 500 nm and 2000 nm (which can be relatively thick to isolate the semiconductor surface from the ambient). Accordingly, the thickness of the low interface state portion 120 can have a thickness that is be between 2.5 to 200 times less than the thickness of the dielectric layer 150.

In some implementations, a dose (e.g., a dose of a dopant or charge concentration) of the JTE implant 140 can vary laterally. A side or portion of the JTE implant 140 relatively close to the active region 104 can be referred to as an active region side or portion 142 of the JTE implant, and a side or portion of the JTE implant 140 further from the active region 104 (toward the right) and disposed in the termination region 102 can be referred to as an termination region side or portion 144 of the JTE implant. For example, a dose of the JTE implant 140 can decrease from left to right (from being highest on the active region side to lowest on the termination region side). Accordingly, charge density can be removed from the termination region side of the JTE implant 140 (relative to the active region side of the JTE implant 140). In some implementations, the JTE implant 140 can have a thickness (or depth) on a side (the active region side or portion) adjacent the doped region 130 (closer to the active region 104) that is less than a thickness of the remainder (the termination region side or portion) of the JTE implant 140 (laterally into the termination region 102). In other words, the JTE implant 140 can have a depth below (or adjacent)

the doped region 130 that is shallower than a depth of the remainder (the termination region side or portion) of the JTE implant 140 (laterally into the termination region 102 and below the dielectric layer 150 (and not below the doped region 130)). In some implementations, the JTE implant 140 can be thinner (or shallower) (in the active region side or portion) because the JTE implant can be formed through the doped region 130. The doped region 130 can have a bottom surface in contact with a top surface of the JTE implant 140 such that the doped region 130 defines and interface with the JTE implant 140.

As shown in FIG. 1, cross-sections or cuts along the SiC power device 100 have different stack profiles. For example, cut B1 has a profile of dielectric layer 150, low interface state portion 120, doped region 130, voltage blocking layer 166, and substrate portion 164. Cut B2 has a profile of dielectric layer 150, low interface state portion 120, doped region 130, JTE implant 140, voltage blocking layer 166, and substrate portion 164. Cut B3 has a profile of dielectric layer 150, low interface state portion 120, JTE implant 140, voltage blocking layer 166, and substrate portion 164. Cut B4 has a profile of dielectric layer 150, JTE implant 140, voltage blocking layer 166, and substrate portion 164.

In some implementations, premature breakdown over a periphery of a device (outside of the active region 104) can result in undesirable performance of the power device 100. A uniform avalanche breakdown can be achieved in the bulk (or active region 104) of the SiC power device 100 using, for example, the termination region 102 configuration shown in FIG. 1. In other words, undesirable breakdown in the termination 102 (before breakdown in the active region 104) can be avoided. The configuration shown in FIG. 1 can have advantages over devices including positive angle beveling and low voltages.

Figure 2:
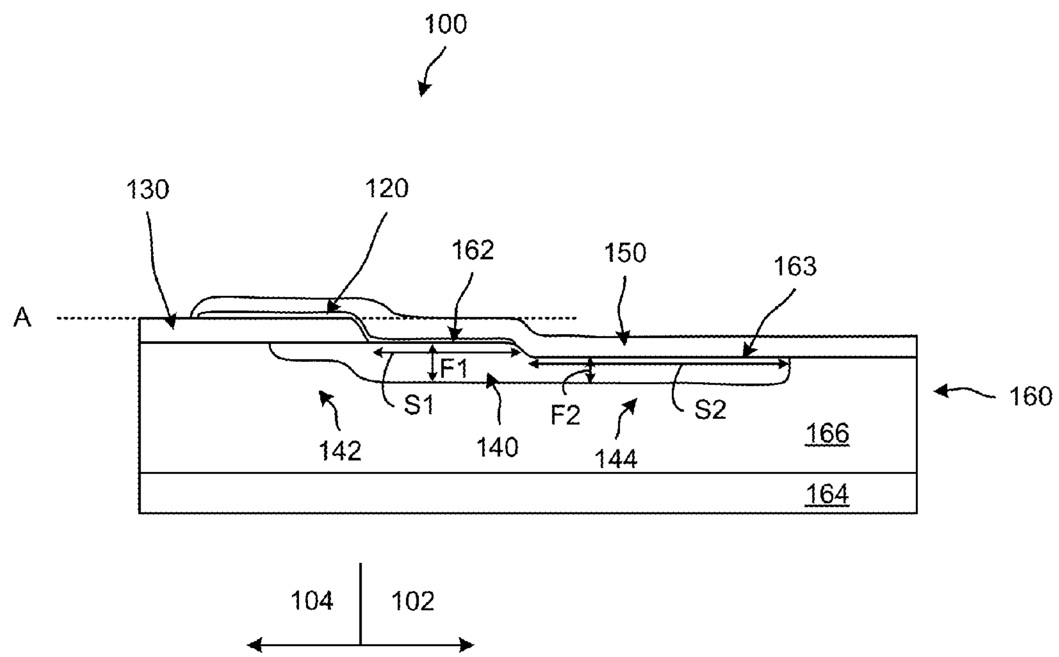
FIG. 2 is a diagram that illustrates a variation of the SiC power device shown in FIG. 1.

FIG. 2 is a diagram that illustrates a variation of the side cross-sectional view of the silicon carbide high voltage high power device 100 shown in FIG. 1. At least some of the features shown in FIG. 1 can be incorporated into FIG. 2.

As shown in FIG. 2, the termination region 102 includes a stair-like profile or multiple zones (in contrast to the single zone shown in FIG. 1). A surface 163 of the semiconductor region 160 has a depth that is lower than a depth of the surface 162. Accordingly, a thickness F1 of the JTE implant 140 associated with surface 162 (which can be referred to as a first zone) is greater than a thickness F2 of the JTE implant 140 associated with surface 163 (which can be referred to as a second zone). The first zone can be disposed between the active region 104 and the second zone. In some implementations, a termination region can have more than two zones (e.g., multi-zone). In some implementations, the termination region 102 can include multiple zones each having (or defining) a top surface at a different depth within the semiconductor region 160.

As shown in FIG. 2, the JTE implant 140 has a first top surface portion defining a first recess associated with the first zone and a second top surface portion defining a second recess associated with the second zone. The first top surface of the JTE implant 140 defines surface 162 (which is a first recess below line or plane A) and the second top surface portion of the JTE implant 140 (which is a second recess below line or plane A). As shown in FIG. 2, the low interface state portion 120 is disposed on the surface 162 (associated with the first zone) and not disposed on the surface 163 (associated with the second zone). In some implementations, the JTE implant 140 defines a top surface of multiple recesses (FIG. 2 illustrates such an example), the low interface state portion 120 can be in contact with at least one of the multiple recesses.

In some implementations, approximately 5-20% of the acceptor density of the entire JTE implant 140 can be removed in the second zone. In some implementations, the thickness F2 of the JTE implant 140 can be 20% to 70% less than the thickness F1 of the JTE implant 140.

In some implementations, the JTE implant 140 according to the embodiments described above may be capable of total or substantial suppression of peripheral breakdown. In some implementations, uniform or substantially uniform bulk avalanche breakdown in the bulk of SiC (e.g., active region) can be achieved. No spots or stripes of light emission along the device periphery due to peripheral avalanche breakdown are observed. For high voltage (e.g., over 400 Volts) SiC devices having near-planar junction termination, uniform avalanche breakdown was not possible without the termination configurations described above. In some implementations, the termination region 102 can be configured to handle (e.g., sustain without failure) at least 50 milli-Joules (mJ) of avalanche energy without failing (e.g., without peripheral breakdown).

Figure 3:
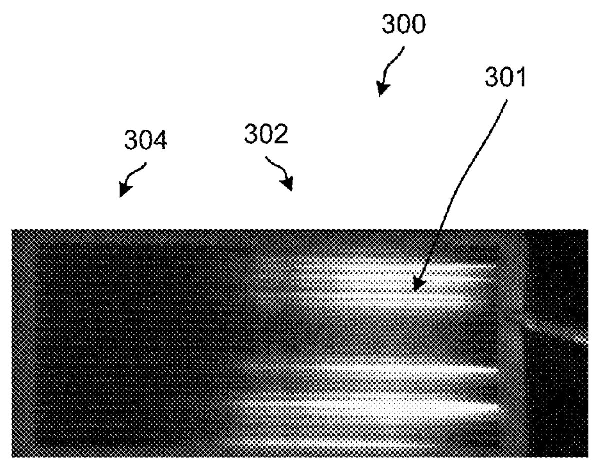
FIG. 3 illustrates a photo micrograph light emission of a SiC PN diode.

In FIG. 3, an almost uniform avalanche breakdown is demonstrated by photo micrograph light emission from a SiC PN diode at a voltage of approximately 1714 volts (V) at a current of approximately 1.5 milli-amperes (mA). The bright area 301 illustrates uniform breakdown across the termination region 302 on the right side of the device and an active region 304 is on a left side of the device. In the implementation shown in FIG. 3, the SiC power device has a relatively large p-type anode area (or power device area) of around 4 $mm^2$.

The termination (including the JTE implant 140) included in the SiC power device 100 (shown in, for example, FIGS. 1 and 2) can provide favorable characteristics (e.g., relatively high energies) for, for example, Unclamped Inductive Switching (UIS).

Figure 4:
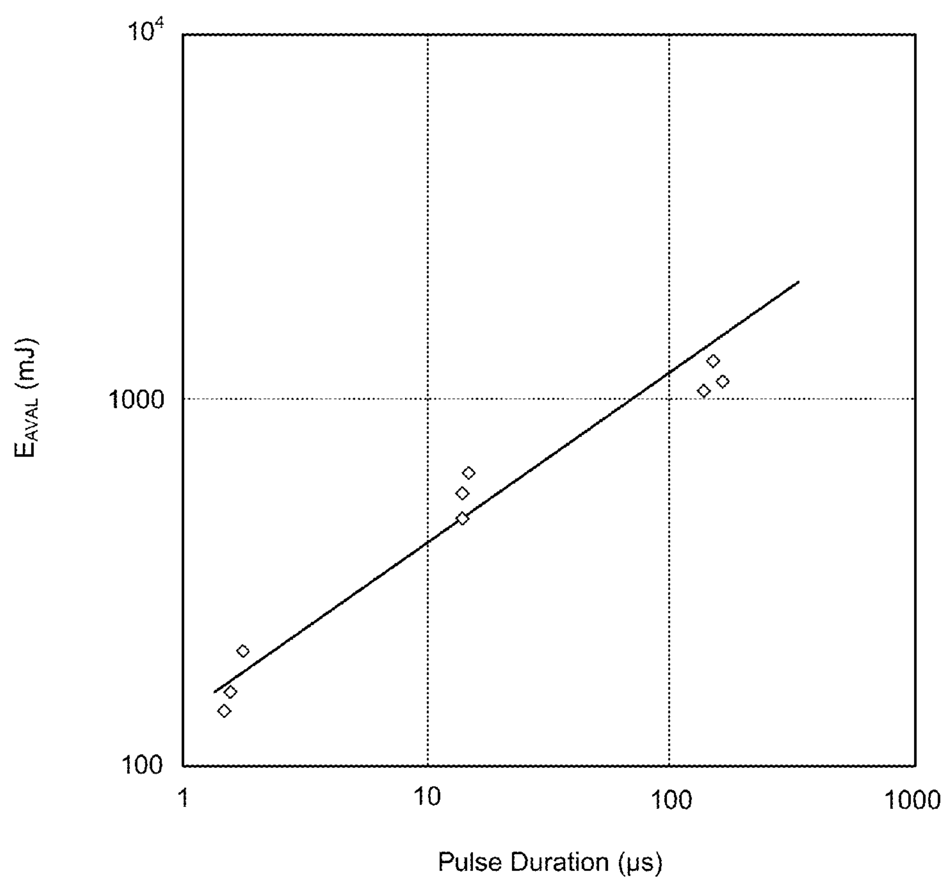
FIG. 4 illustrates a sustained Unclamped Inductive Switching (UIS) energy as a function of pulse length.

FIG. 4 is a graph that illustrates a sustained (e.g., a maximum sustained) UIS energy (or avalanche energy along the y-axis) as a function of pulse duration or length (shown as time in microseconds along the x-axis). In other words, FIG. 4 illustrates single-pulse avalanche energy. Each of the pulses are shown as diamonds and a trend line through the data is illustrates as a straight line. The avalanche energy was obtained by integration of dissipated power, i.e. of the product of avalanche current times the voltage over the time. The current traces were approximately triangular, i.e. the coil current linearly decreased with time after turn-off of the switch that was used to control the energy stored in the induction coil. The three groups of data points having approximately the same pulse duration correspond to the coil inductance L values of L=0.02 mH (for the shortest pulse around 1.5 μs), L=0.5 mH (for the medium-duration pulse around 15 μs) and L=20 mH (for the longest pulse around 150 μs) The avalanche breakdown voltage was around 2 kV, whereas the peak avalanche current decreased from around 180 A for the shortest pulse (for L=0.02 mH) to around 8.5 A for the L=20 mH. The UIS energy is approximately 2 times higher than, for example, some known SiC devices (e.g., a 1200 V SiC junction-blocked Schottky (JBS) diode with Ea=200 mJ for inductance of 0.6 milli-Henries (mH) and 4 $mm^2$ anode area). In this example implementation, the diode (included in the SiC power device 100) can have an energy of approximately 500 to 600 mJ for 0.5 mH and a 4.76 $mm^2$ anode.

Figure 5:
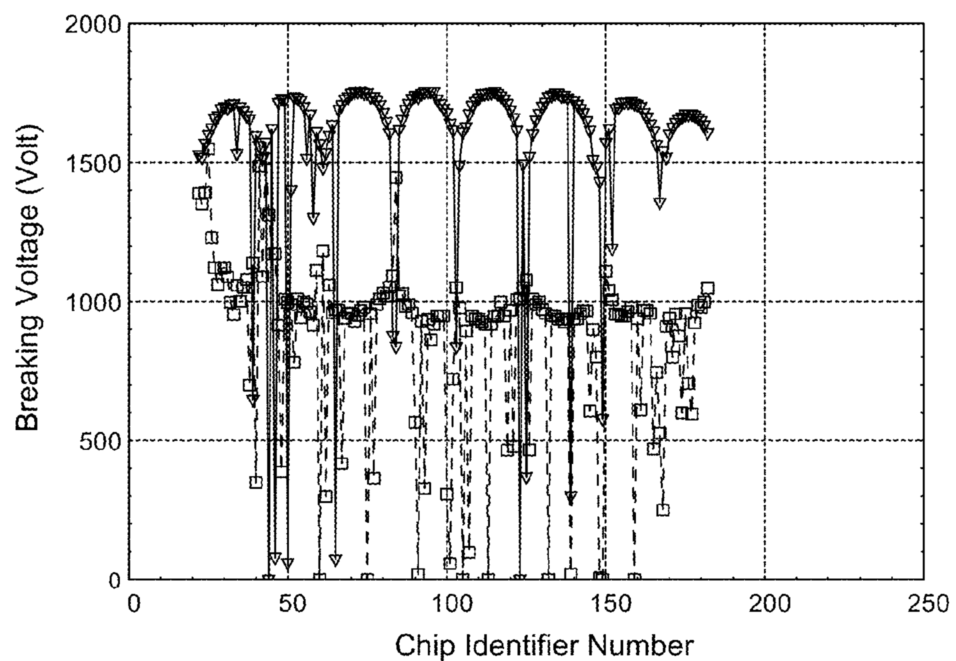
FIG. 5 is a graph that illustrates a distribution of breakdown voltages.
Figure 6:
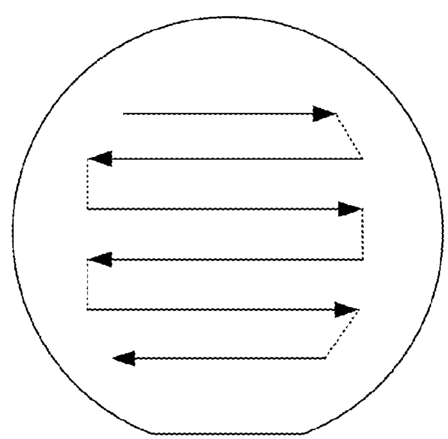
FIG. 6 illustrates a probe pattern associated with the graph in FIG. 5.

FIG. 5 is a graph that illustrates a distribution of breakdown voltages (on the y-axis) over an area of a SiC power BJT wafer (Vcbo) before (in a single zone such as that shown in FIG. 1) and after an etch (in a second zone such as that shown in FIG. 2) into a periphery of an ion-implanted JTE. The single zone test results are illustrated with squares and the two zone test results are illustrated with upside-down triangles. The before etch and after etch in this implementation each include a low interface state portion (e.g., a low interface state dielectric). In some implementations, the etch can be on the order of a hundred nanometers in depth (e.g., 50 nm, 150 nm, 250 nm). In some implementations, the implanted dose can be an aluminum (Al) dose of approximately $1.7\times10^{13}$ $cm^{-2}$. In some implementations, the implant can include a different material (a different dopant) and/or can be a different concentration (higher or lower). In some implementations, the device chips (which have chip identifier numbers in FIG. 5 on the x-axis) included in the wafer can be probed sequentially in a serpentine pattern as shown on the schematic wafer image shown in FIG. 6. In this implementation, the etch increases voltage breakdown by over 60%. The breakdown voltage profiles of etched JTE mirror the U-shaped distribution of donor in the low-doped collector over the wafer area. In some devices, device termination techniques may be based on measurements that are done on very few or single selected components. This approach can result in technologies that are not applicable to commercial manufacturing or scaling. FIG. 5 illustrates that a small amount of operable high-voltage devices can be achieved. A few data points on the curve marked as single zone in FIG. 5 are indeed acceptable from the standpoint of blocking voltage, for which the target is approximately 1200 Volt in the case for the data plotted in FIG. 5. However, the yield of operable high voltage devices might in fact be very low, which requires improved junction termination techniques, such as those disclosed herein.

Figure 7B:
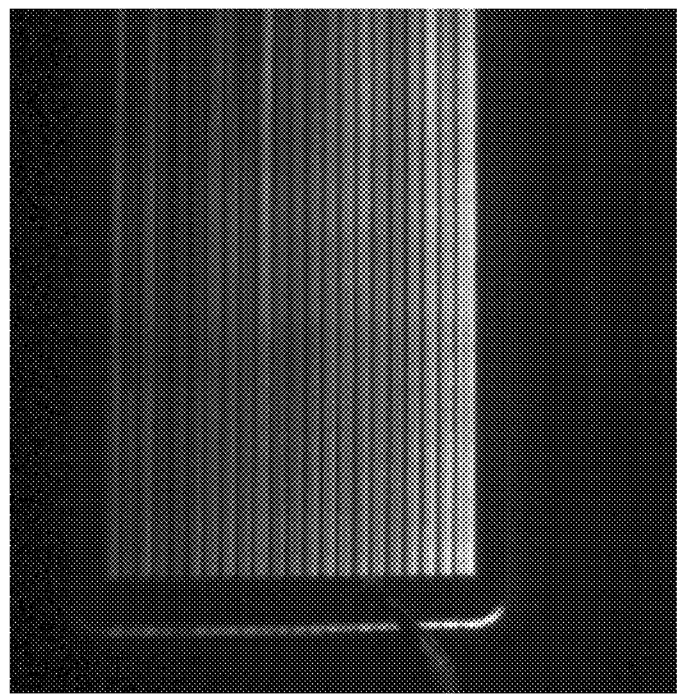
FIG. 7A through 7D illustrate top view images of a test PN diode with a mesh electrode.
Figure 7A:
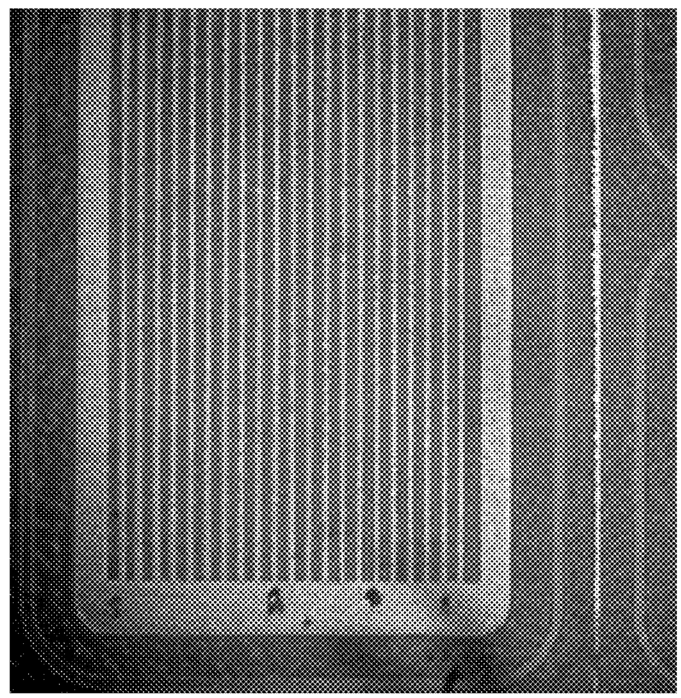
Figure 7D:
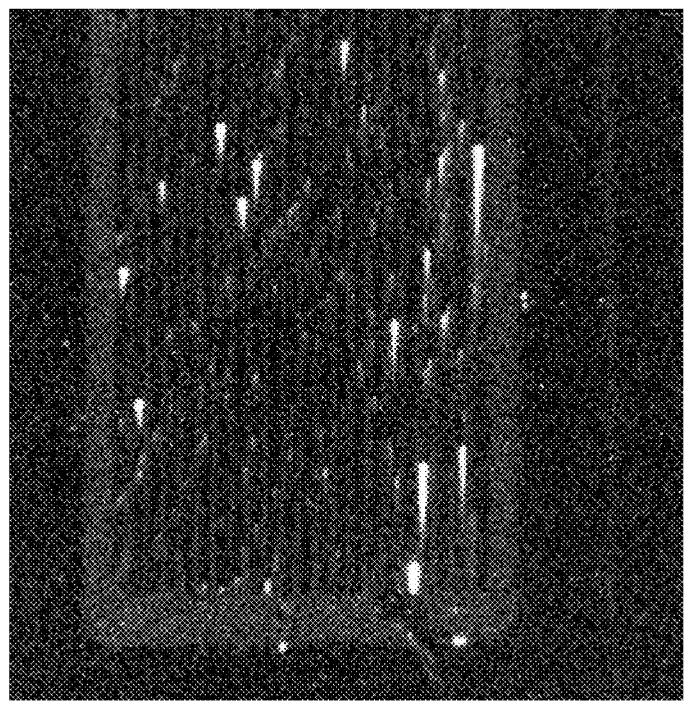
Figure 7C:
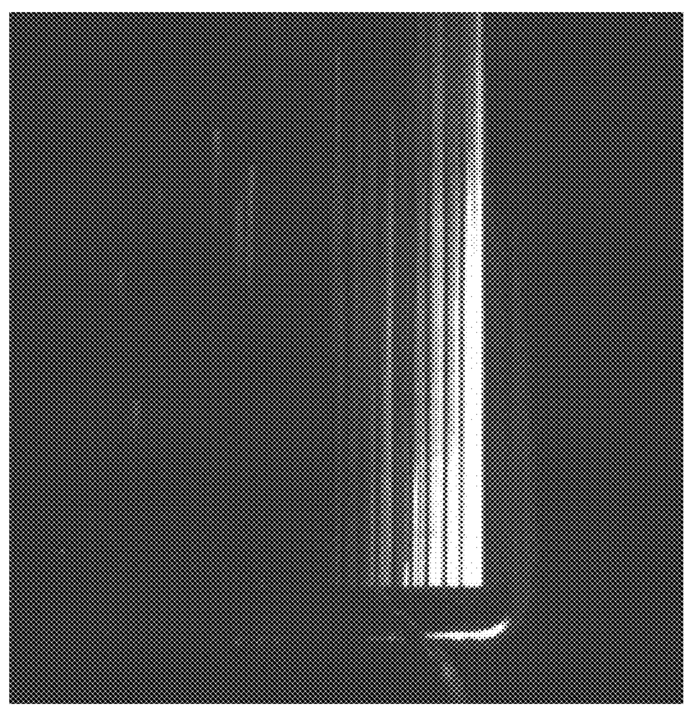

FIGS. 7A through 7D illustrate top view images of a test PN diode with a mesh electrode. FIG. 7A-7D illustrates stages of development of near-uniform breakdown at currents of 0 mA (FIG. 7A), 10 mA (FIG. 7B), 0.5 mA (FIG. 7C), and 0.005 mA (FIG. 7D). The reverse bias is 0 V (FIG. 7A), 1772 V (FIG. 7B), 1770 V (FIG. 7C), and 1669 V (FIG. 7D). The streaky pattern in the images of FIGS. 7C and 7D can appear from field concentration at material imperfections. As illustrated in FIGS. 7A-7D, peripheral breakdown does not occur at any stage of development of avalanche breakdown (not even at 99.8% of the bulk breakdown voltage). In FIG. 7A, areas that are brighter with rounded edges in the image are the regions 163 shown in FIG. 2 etched into SiC.

The SiC power devices described herein have greatly decreased area of the termination region as compared to the designs that are employed in known devices. In some implementations, a breakdown voltage can change with changes in a ratio between a width of a first zone (e.g., a lateral zone width) and a width of a second zone (e.g., a lateral zone width). Illustration of these zone widths (or length) are shown as first zone S1 and second zone S2 in FIG. 2. The first zone S1 can be disposed between the active region 104 and the second zone S2. Both the first zone S1 and the second zone S2 are disposed in the termination region 102. Breakdown voltage characteristics based on zone width (or length) are illustrated in, for example, FIG. 8.

Figure 8:
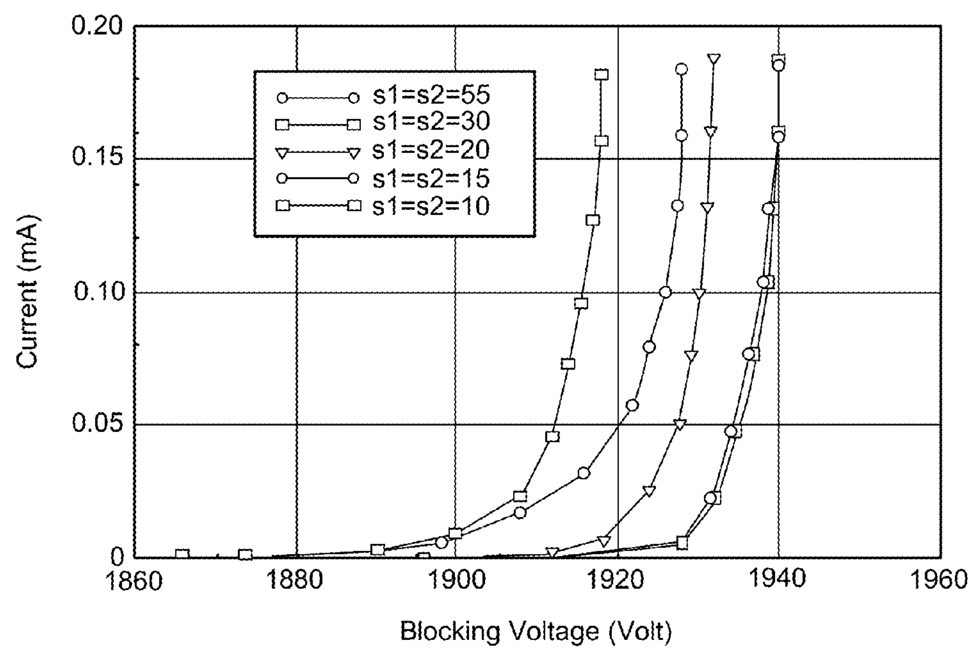
FIG. 8 is a graph that illustrates breakdown voltage based on zone ratios.

As shown in the graph in FIG. 8, a first zone is labeled S1 and a second zone can be referenced as S2. The graph in FIG. 8 illustrates blocking voltage along the x-axis and current in mA along the y-axis. As shown in FIG. 8, a 1.5% decrease of a blocking voltage (which can be referred to as a breakdown voltage) occurs with a decrease of the JTE width for each of the zones from 55 microns to 10 microns. In FIG. 8, the width of zone S2 is equal to the width of zone S1. In some implementations, the width of zone S1 can be different than (e.g., longer than, shorter than) the width of zone S2. Narrowing of the junction termination width results in improved utilization of the chip area, which may be desirable in, for example, commercial manufacturing.

Figure 9:
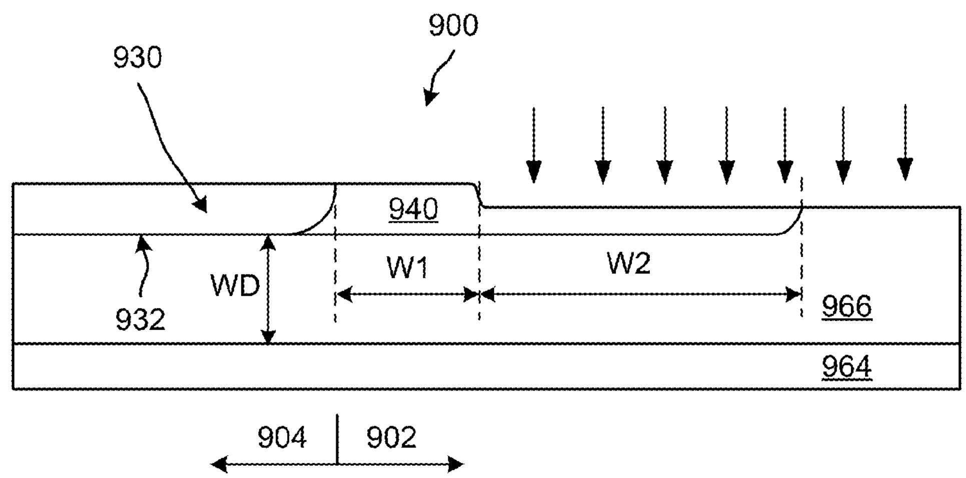
FIG. 9 is a diagram that illustrates formation of a high voltage termination within a SiC power device.

FIG. 9 is a diagram that illustrates formation of a high voltage termination within a SiC power device 900 in accordance with the implementations described herein. The implementation shown in FIG. 9 is derived at least from the implementations shown in FIGS. 1 and 2.

In this implementation, a high voltage termination in a termination region 902 is formed by ion implantation of acceptor ions into an n-type voltage blocking layer 966 (e.g., a low-doped n-type voltage blocking layer), which is above a substrate 964 (e.g., n-type substrate). In some implementations, acceptor ions can be activated by a high temperature anneal between, for example, approximately 1500° C. and 1800° C. In some implementations, the dose of the electrically active acceptors of the implant can slightly exceed the characteristic acceptor dose, $Q_{aval}$, $Q_{aval}=\in\in E_{aval}/q$, where $E_{aval}$ is the peak electric field at avalanche breakdown, $\in$ the relative permittivity of SiC, $\in_0$ is the vacuum permittivity, and q is the electron charge. Using these processes, a JTE implant 940 is defined within the termination region 902. An active region 904 is also indicated in FIG. 9.

In some implementations, an outer region of a JTE termination can be thinned down by an etch (e.g., a reactive ion etch, a plasma etch), which is illustrated with vertical arrows, so as to decrease the electrically active acceptor dose to a number, which is slightly below $Q_{aval}$. In some implementations, the lateral extensions of each JTE zone W1 and W2 can exceed approximately ½ (or more or less) of a drift region thickness WD. Although not illustrated, after the etch, a low interface state portion (e.g., low interface state portion 120) and a dielectric layer (e.g., dielectric layer 150) can be included in (e.g., disposed on) the SiC power device 900.

In some implementations, an electric field at the JTE termination of a SiC PN diode (at PN interface 932), can have advantages in a two-zone termination over a single-zone termination. For a low acceptor dose, strong concentration of electric field can occur at the edge of the diode anode. A higher dose can result in a relatively strong field concentration around an outer edge of the JTE implant. In some implementations, the boundary of the JTE to the active region can be referred to as the inner edge of the JTE, whereas the other edge of the JTE implant can be referred to as the outer edge of the JTE. In some implementations, a two-zone termination can suppress the electric field concentration.

As noted above, the configurations described herein can result in an increase of breakdown voltage in the termination region 902 over other designs. In some implementations, in the configurations described herein, the hot carriers due to breakdown may be trapped into a dielectric at the SiC surface. The charge due to carrier trapping can result in an increase in the breakdown voltage.

Figure 10A:
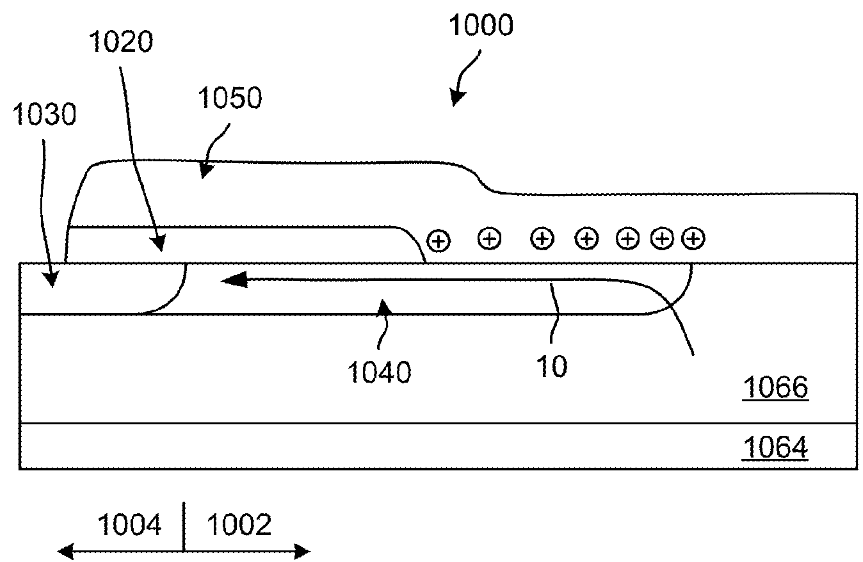
FIG. 10A is a diagram that illustrates one possible theory associated with the devices described herein.

FIG. 10A is a diagram that illustrates one possible theory associated with the SiC power devices described herein. In some implementations, hot carrier capturing may not be identical for two types of insulators: much lower capturing may be expected for the low interface state portion 1020

(e.g., low interface state dielectric) than the high interface state portion 1050. The hot carrier path is illustrated as arrow 10 and charge trapping locations are represented by circles with plus signs. This difference in capturing can provide a step in sheet electric charge of the JTE implant 1040. Such a JTE charge profile can be desirable for a minimization of electric field spikes. The capturing process may be also self-controlled, at least within a certain range of implanted acceptor dose (e.g., implanted Al acceptor dose).

In some implementations, SiC can be more susceptible to failure at the spots of localized breakdown than silicon (Si), because of, for example, the dynamic resistance of an avalanching junction is inversely proportion to the square of the breakdown field. For SiC, this can result in a factor of one-hundred (100) difference compared with silicon. The reliability of SiC power devices can be significantly improved by suppressing early avalanche breakdown at the periphery of the SiC power devices. In some implementations, a termination of a SiC power device can have at a least zone etched into an ion implanted JTE with a breakdown voltage over 95% of the bulk value. This possibility is not obvious in view of the fact that simulations predict much stronger concentration of electric field by the periphery.

Figure 10B:
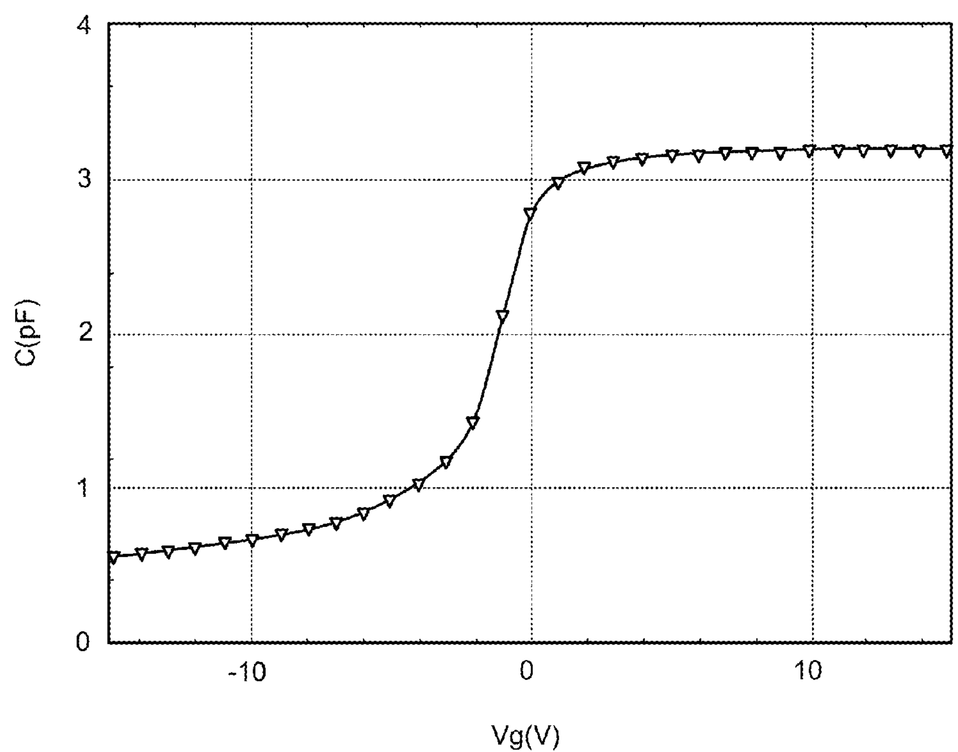
FIG. 10B is a diagram that illustrates a capacitance-voltage characteristic of a structure formed using a low interface state density dielectric.

FIG. 10B is a graph that illustrates a capacitance-voltage characteristic of a metal-oxide-semiconductor (MOS) structure, which is formed using the low interface state portion (e.g., low interface state density dielectric (e.g., a low interface state density oxide)). The MOS capacitance (C) is illustrated along the y-axis and gate voltage (Vg) is illustrated along the x-axis. As mentioned above, such low interface state portions can be, for example, formed by depositing an oxide onto SiC with subsequent high-temperature anneal in $N_2O$-containing ambient. The MOS capacitor, in this implementation, has a diameter of approximately 0.1 millimeter (mm). The capacitance-voltage characteristic shows a clear accumulation region at a positive gate bias and a region of deep depletion at a negative gate bias, which indicates a low density of interface traps. This high quality interface is, in this case, formed by passivation of dangling bonds in the near-interface layer of silicon oxynitride, which layer can be a result of annealing the silicon dioxide layer on SiC in presence of $N_2O$. In contrast, as-deposited chemical-vapor deposited (CVD) or plasma-enhanced CVD (PECVD) silicon dioxide may have a high density of interface traps, and may not show as pronounced accumulation region as that shown in FIG. 10B. Other techniques can be also applied for formation of low interface trap density dielectrics on SiC. As an example, the layer of silicon dioxide can be formed by thermal oxidation rather than by deposition. In some implementations, hydrogen passivation of interface traps may be used instead of nitrogen passivation through annealing the interface in wet oxygen. In some implementations, hydrogen passivation can be also combined with nitrogen passivation.

Figure 11A:
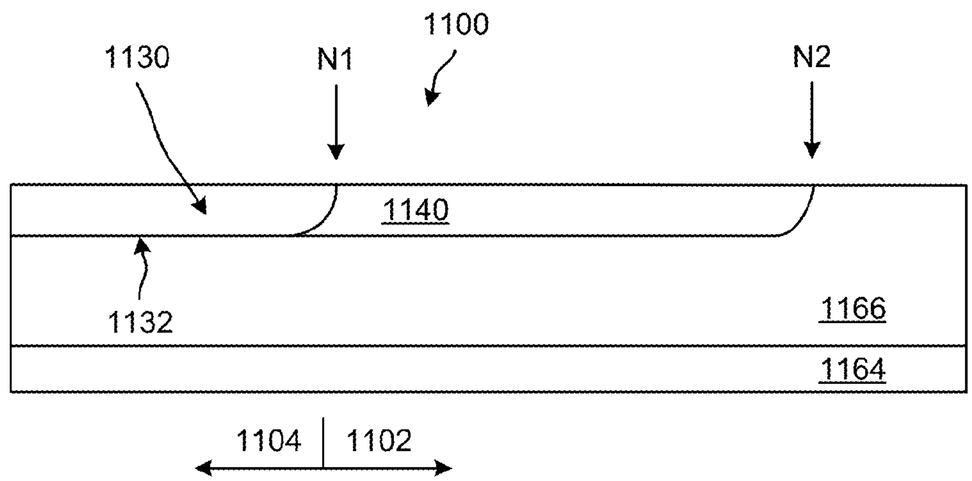
FIGS. 11A and 11B are additional schematic cross-sections of structures of SiC power devices.
Figure 11B:
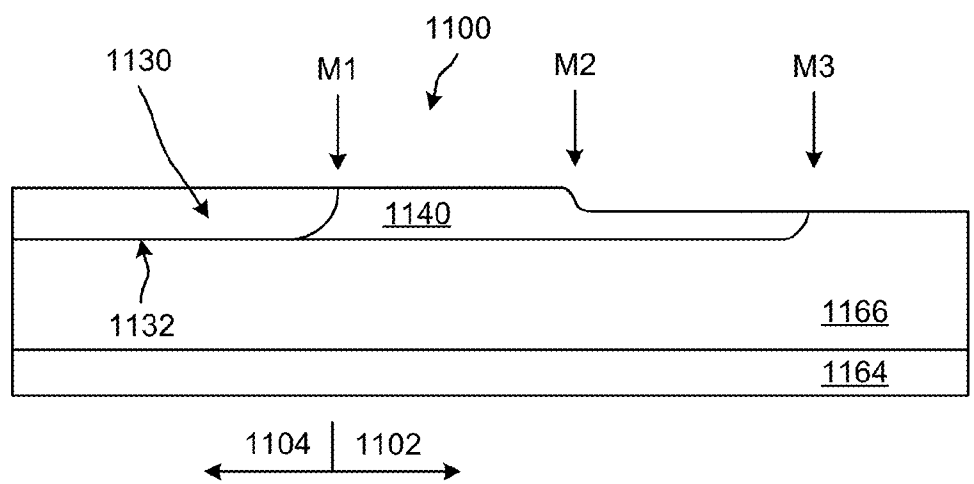

FIGS. 11A and 11B illustrate schematic cross-sections of an edge of an ion-implanted PN diode with a JTE (similar to those described and shown above). FIG. 11B shows a cross-section of the device 1100 shown in FIG. 11A after partial removal of the ion-implanted JTE implant 1140 from the outer portion of the JTE implant 1140 to define a two-zone device. In other words, FIG. 11A illustrates a single-zone device and FIG. 11B illustrates a two-zone device. Both devices 1100 are illustrated without a low interface state portion or dielectric layer. A doped region 1130, a substrate 1164, an active region 1104, and a termination region 1102 are illustrated.

Figure 11C:
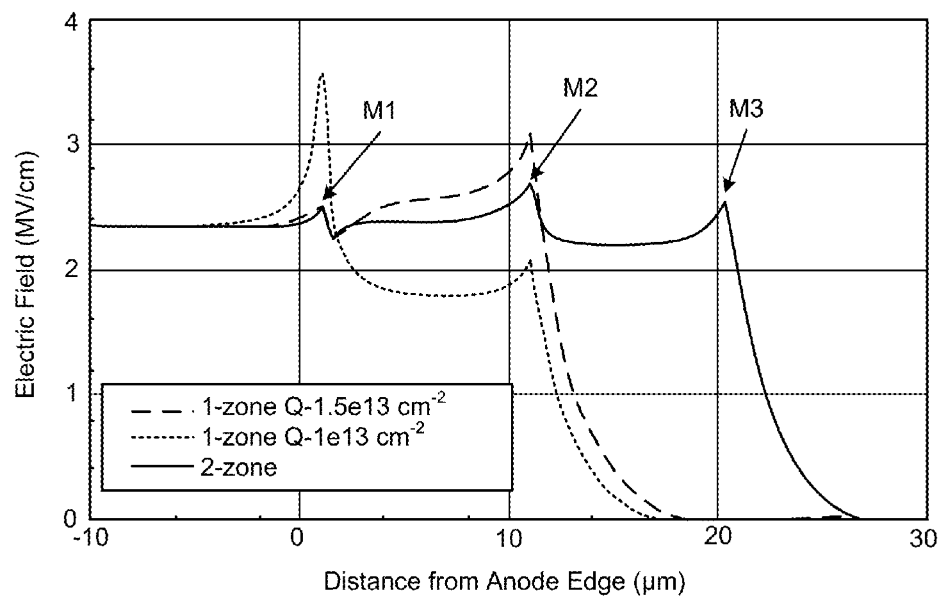
FIG. 11C represents the results of a two-dimensional solution of a Poisson equation.

FIG. 11C shows the lateral profile of electric field in the vicinity of the crystal surface, which is simulated using two-dimensional technology software by solving the Poisson Equation. FIG. 11C illustrates the electric fields for devices similar to those shown in FIGS. 11A and 11B. The blocking layer (e.g., block layer 1166) thickness in this simulation is approximately 10 μm (although the thickness is presented by way of example only). The JTE implant length of a single-zone (1-zone) JTE implant is approximately 10 μm (e.g., point N1 to N2 in FIG. 11A), a two-zone (2-zone) JTE has a length of approximately 10 μm in both the first (inner) JTE zone (e.g., point M1 to M2 shown in FIG. 11B) and for the second (outer) JTE zone (portion M2 to M3 shown in FIG. 11B).

The profile of electric field for the single-zone JTE shows two peaks at the anode edge (in the vicinity of x=0 (i.e., N1 in FIG. 11A)) and at the outer edge of the JTE, at approximately x=10 (i.e., N2 in FIG. 11A). The relative height of these peaks depends on JTE dose (i.e., 1.5e13 $cm^{-2}$ or 1.0e13 $cm^{-2}$), however both of them are present in the profiles (including the two-zone profile). In some implementations, depending on the acceptor dose in the JTE, the avalanche breakdown can occur either at the inner edge of the JTE (at x=0), or at the outer edge of the JTE (at x=10) or at both locations.

Figure 11D:
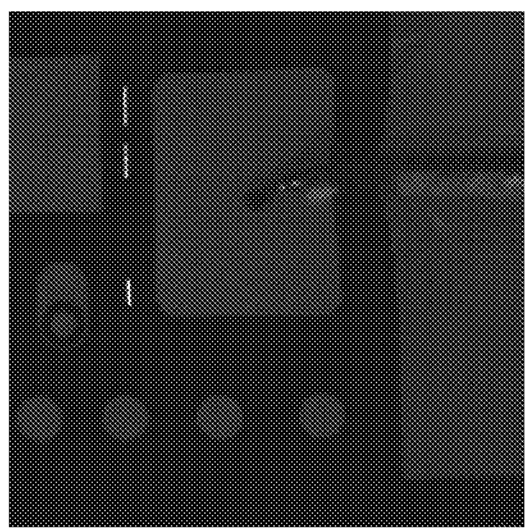
FIG. 11D is a combined emission and optical reflection image of an avalanching test device.

An image of emission due to highly localized avalanche breakdown at the outer JTE edge of a test structure is shown in FIG. 11D. The test structure imaged in FIG. 11D is lacking any etched second JTE zone and corresponds to the cross-section schematically shown in FIG. 11A. A high voltage of around 1200 Volt was applied to the device. The emission occurs due the avalanche current of around 0.1 mA and is seen in FIG. 11D as portions of a bright vertical line to the left from the anode contact. The emission is superimposed on reflected-light image by illuminating the diode wafer with the prober microscope lamp. The image distortion is due to the dielectric liquid used for prevention of air-gap sparks. Further increase of the reverse current in this component results in component destruction due to high density of power dissipation. This happens at an avalanche current of a few mA, even in the pulsed mode of operation. With highly localized breakdown as in this case, it may not be (or is not) possible to achieve a total avalanche current between approximately 10 A and 200 A (which are currents presented by example).

Referring back to FIG. 11C, it is further demonstrated by solution of the Poisson Equation for the two-zone (or multi-zone) JTE, that the multiple-zone design may not (or does not) eliminate the additional peaks of the electric field at the edge of the adjacent JTE zones. Such additional peaks are visible at the anode edge (in the vicinity of x=0 (i.e., M1 in FIG. 11B)), at approximately x=10 (i.e., M2 in FIG. 11B), and at the outer edge of the JTE, at approximately x=20 (i.e., M3 in FIG. 11B) for the simulation of the two-zone termination plotted in FIG. 11C. In some implementations, it may not (or is not) possible to keep the electric field in all (or many) locations of the JTE region (i.e. at locations N1, N2, M1, M2, and M3) and/or stay below the electric field in the anode region, i.e. at x>0. Peaks M1 and M3 (shown in FIG. 11C) will appear due to electric field concentration at inner and outer edge of the JTE respectively. Peak M2 (shown in FIG. 11C) will appear in a two-zone JTE at the interface of the two JTE zones that have different acceptor charge. Such peaks of electric field cause localized early breakdown and these locations may have an avalanche breakdown at an earlier voltage than the anode. Highly localized early breakdown can potentially result in device failure at a low avalanche current under the conditions of UIS.

The implementations according to this description have favorable avalanche robustness as compared to what is expected from solutions of the Poisson equation. The avalanche current tolerated by devices according to these implementations is high, approximately 10 A to 200 A at a reverse bias of around 2 kV, as is demonstrated in, for example, FIG. 4. Further on, emission images shown in FIG. 7 do not show regions of early breakdown in expected weak spots, such as locations M1, M2, or M3. There exists a contradiction between the results of the Poisson Equation solution, which are unexpected due to the fundamental nature of the Poisson Equation.

The model presented within discussion of FIG. 10 provides one possible explanation of the results presented in this disclosure. In some implementations, interface trapping of mobile carriers may affect the charge balance under the conditions of avalanche breakdown. The trapped carriers may smooth the peaks of electric field in locations M1, M2 and M3. In some implementations, other phenomena, other than the interface charge trapping, may be involved. In some implementations, carrier traps may also originate from residual damage due to ion implantation in SiC or even from the dry etching procedure that is used for partial material removal in the JTE region. Further on, the charge trapping phenomena might be dynamic rather than static. These trapping phenomena that result in better-than-theoretical performance are disclosed by example only and may not be the only mechanisms.

The termination regions and structures including a JTE implant (as described above) may be used in connection with any of the active devices described below in connection with FIGS. 12 through 14. These active devices can be included in, for example, an active region.

Figure 12:
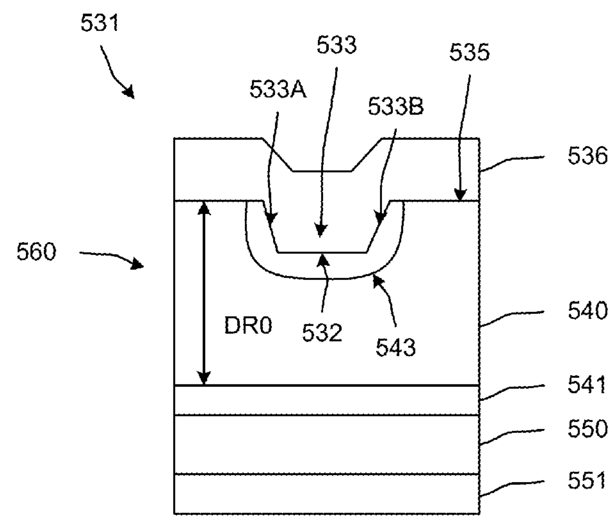
FIGS. 12 and 13 illustrate a SiC junction-blocked Schottky-barrier rectifier (JBS).

FIG. 12 represents a unit cell 531 of a Schottky-barrier diode rectifier. The unit cell 531 of the rectifier can be formed on an off-oriented heavily doped n-type 4H SiC substrate 550. A lightly doped n-type epitaxial drift region 540 having a thickness DR0 is disposed on the substrate 550. An optional buffer layer 541 is disposed between substrate 550 and drift region 540 to, for example, mitigate substrate crystal imperfections. The doping (e.g., doping concentration or doping level) of the buffer layer 541 can be at least several times higher than the doping of the drift region 540 in some implementations, however it could approach the n-type doping of the substrate 550. The unit cell 531 can include a trench 533 having a trench bottom 532 (or bottom surface) and trench sidewalls 533A and 533B. A heavily doped ion-implanted p-type region 534 can be included adjacent the trench sidewalls 533A, 533B and trench bottom 532. A heavy acceptor doping exceeding $10^{20}$ $cm^{-3}$ can be included in the region 531, at least near the trench bottom 532 and/or the surface of trench walls 533A and 533B. A portion 535 of the SiC mesa surface can have an n-type conductivity. A metal contact 536 can be included on top of the semiconductor region 560 so as to form a Schottky barrier to n-type portions of SiC the portion 535. An Ohmic contact with contact 551 can be included at the back side of the crystal. Implanted regions of neighbor unit cells (similar to unit cell 531) can form a periodic PN diode grid, which can be oriented (or shaped) in an elongated fashion along an off-orientation direction OD as described herein.

One advantage of using a PN diode grid in a Schottky-barrier rectifier is electrostatic shielding of shielding of the Schottky-barrier metal, which could be otherwise exposed to, for example, a high electric field. Avalanche breakdown in a junction barrier Schottky (JBS) diode can occur at the PN-diode grid, which can resolve reliability issues that can arise in a non-shielded Schottky-barrier rectifier. The trench design of the JBS can be more readily design optimized as compared to a fully planar design, because the depth of the p-body can be readily increased to a specified value without using, for example, high implant energies (which may not be practical in manufacturing).

Another advantage of the PN diode grid is its handling of a high forward surge current. A Schottky-barrier rectifier without a built-in PN body diode may not be as robust in handling an overload in on-state current, because device self-heating results in a drop in carrier mobility and in increase of the forward voltage drop as result. In contrast, the PN diode grid of a JBS rectifier can have a behavior, which is similar to the behavior of a planar PN diode. A high forward bias in a PN-diode can result in injection of minority carriers, which can minimize the forward voltage drop and permit relatively fail-safe operation under the conditions of forward-current overload. Though beneficial, such injection represents a reliability risk due to the bipolar degradation via growth of stripe-type stacking faults. According to this embodiment, such risk is mitigated by sectioning the rectifier in elongated sub-components as described herein.

The high power rectifier is sectioned in two or more elongated sub-component rectifiers of smaller area, each sub-component having the longer side that is parallel to the off-orientation direction. Each sub-component can include an array of unit cells 531. A cross-section of the region between sub-component rectifiers according to this embodiment is shown in, for example, FIG. 13.

Figure 13:
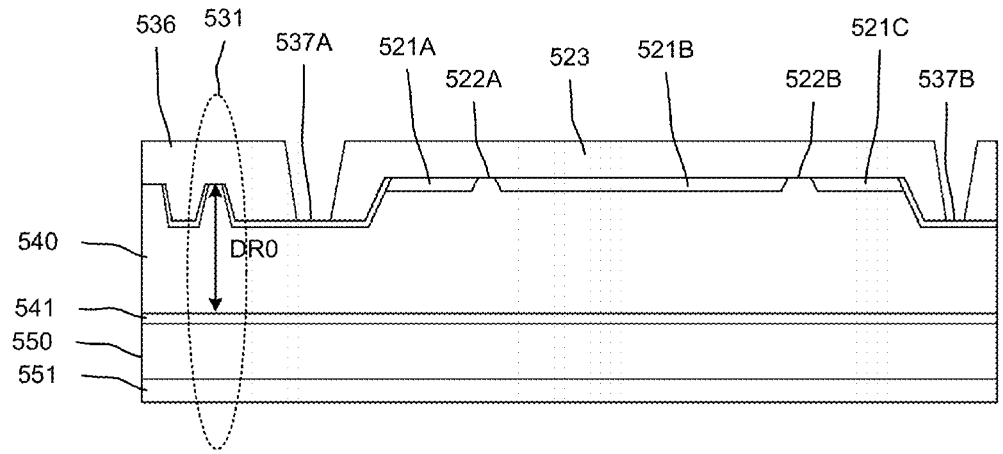

A sub-component rectifier can include a continuous rim of anode implant 537 as shown in FIG. 13. In FIG. 13 such rims are shown as 537A and 537B for two neighbor sub-components. Field-limiting regions 521A, 521B, and 521C are disposed between the adjacent rectifiers to avoid or minimize electric field concentration. Regions 521A, 521B, and 521C are provided medium-dose acceptor implant. The role of the field-limiting regions can be same as that of a Junction Termination Extension at the device periphery as described herein. The requirements to optimum implant dose in these regions can be the same as those known for design of the JTE. The optimum dose of electrically active acceptors can be slightly (approximately 5% to 20%) lower, that the characteristic dose $Q_A$, which dose $Q_A$ corresponds to full depletion of such p-type region at the conditions of avalanche breakdown. The characteristic dose $Q_A$ is governed by the Gauss Law, $Q_A=E_{CR}\in_0\in_R/q$, where $E_{CR}$ is the critical field for avalanche breakdown, $\in_0$ the vacuum permittivity $\in_R$ the relative permittivity of SiC and q the electron charge. Gaps 522A and 522B in p-implant can be formed between regions 521A and 521B, as well as between 521B and 521C. The gaps 522A and 522B can be formed with a relatively narrow width that can be substantially smaller than the thickness of the drift region DR0. Forming the gaps 522A, 522B in the field-limiting implant substantially narrow will prevent excessive concentration of electric field next to the gaps 522A, 522B. The gaps 522A, 522B can prevent (or substantially prevent) lateral current flow under the conditions of a high forward bias and it will therefore assist termination of stacking fault (SF) propagation. The number of gaps 522A, 522B in the field-limiting implant can optionally be greater than 2 so as to further assist suppression of SF propagation. The SiC surface in the region between neighbor subcomponents can further include a dielectric coating 523.

Figure 14:
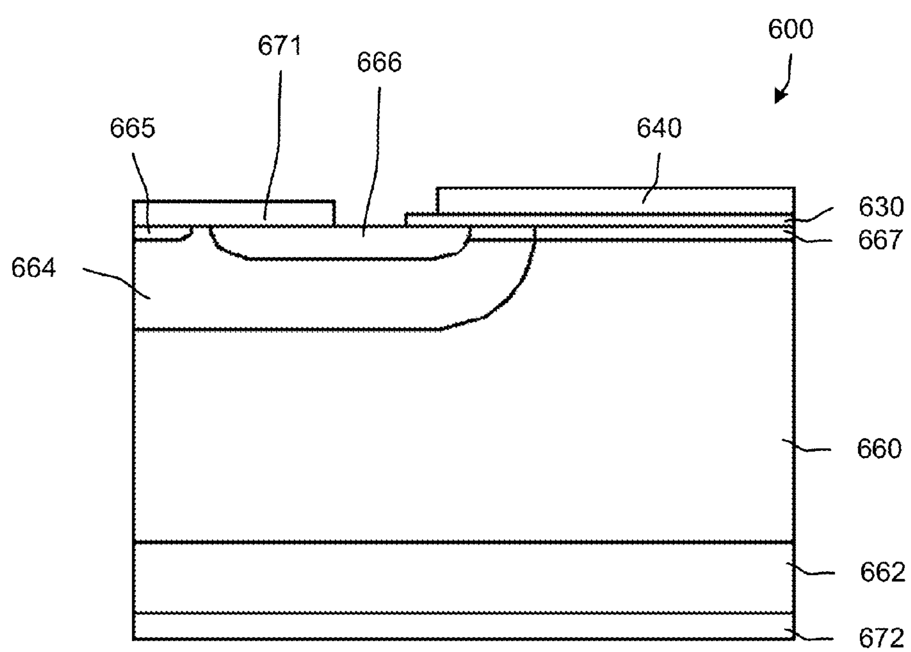
FIG. 14 is a block diagram that illustrates a unit cell of a cross-sectional view of a shielded SiC metal-oxide-semiconductor field-effect transistor (MOSFET) device.

FIG. 14 is a block diagram that illustrates a unit cell 600 of a cross-sectional view of a shielded SiC metal-oxide-semiconductor field-effect transistor (MOSFET) device (also can be referred to as a vertical MOSFET device). As shown in FIG. 14 an epitaxial layer 660 (e.g., N-type) is disposed over a substrate 662 (e.g., N+ substrate). A source region 666 (e.g., N+ source region) and a body region 664 (e.g., p-type body region) are formed. A heavily doped p-type subcontact region 665 is formed in the body region 664 to, for example, minimize resistance of the contact to the body region 664. A shallow donor implant region 667 that can have dose between approximately $10^{12}$ and $5\times10^{12}$ $cm^{-2}$ is further included for, for example, control of a desired MOSFET threshold voltage. The MOSFET can be normally in an off-state, and can include a gate dielectric 630. Gate 640 can overlap the top surface including a portion of the source region 666 a portion of the body region 664 and a surface of the lightly doped n-type SiC. A source contact 671 can be applied to a well in the gate dielectric 630, which contact can also define an Ohmic contact to the body region 664 via the subcontact region 665. A drain 672 contact can be included on a back side of the substrate. Source and drain contacts 671 and 672, respectively, can be formed by sintering nickel (Ni) to SiC so as to define a nickel silicide. In some embodiments, the gate dielectric 630 is a silicon dioxide with a layer of silicon oxynitride adjacent to a dielectric interface to the SiC. Such a near-interface oxynitride layer can be formed by a high-temperature anneal of silicon dioxide dielectric on SiC in an ambient containing $N_2O$ or NO.

The unit cell 600 shown in FIG. 14 can be duplicated in a large array to define a MOSFET (also can be referred to as a MOSFET array). The unit cell 600 may be included in a 1-dimensional linear array or may be arranged as a 2-dimensional array in, for example, a rectangular or in a hexagonal pattern. The array can include 2-level metallization using interconnect techniques, which can be utilized in silicon power MOSFET technology. The MOSFET in an array according to this embodiment should be substantially elongated along the direction of off-orientation direction OD, in a similar manner to, for example, that disclosed for SiC rectifiers herein. The MOSFET can alternately sectioned in elongated sub-components in the manner similar to that described herein.

In some implementations, a body diode of the unit cell 600 of the MOSFET can be used as a rectifier, for example, in an inverter circuit. The injection of minority carriers may provoke growth of, for example, stripe-shaped stacking faults. The elongated shape of MOSFET array (or of sub-component a MOSFET array) can mitigate the degradation due to the growth of stacking faults.

Although the behavior of the circuits shown and described in the graphs herein as making transitions at specified voltages and at specified times, when implemented, the transitions of components may occur slightly before or slightly after the specified voltages, specified times, and/or so forth. Specifically, variations in threshold voltages, processing variations, temperature variations, switching speeds of devices, circuit transition delays, and/or so forth can result in conditions (e.g., non-ideal conditions) that can trigger transitions of components slightly before or slightly after the specified voltages, times, and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:

a semiconductor region including a silicon carbide material;

a junction termination extension (JTE) implant region disposed in the semiconductor region; and a low interface state density portion of a dielectric layer having at least a portion in contact with the JTE implant region.

2. The apparatus of claim 1, further comprising:

a drift region having a first conductivity type; and a doped region having a second conductivity type, the doped region being different from the JTE implant region, the JTE implant region having the second conductivity type.

3. The apparatus of claim 1, wherein the low interface state density portion includes a first portion aligned along a top surface of the semiconductor region and a second portion disposed within a recessed region that is recessed below the top surface of the semiconductor region.

4. The apparatus of claim 1, further comprising:

a doped region having a bottom surface in contact with a top surface of the JTE implant region, the low interface state density portion being in contact with a top surface of the doped region and in contact with a top surface of the JTE implant region.

5. The apparatus of claim 1, further comprising:

a high interface state density portion of the dielectric layer disposed on the low interface state density portion such that a first portion of the low interface state density portion is disposed between the high interface state density portion of the dielectric layer and a doped region and a second portion of the low interface state density portion is disposed between the high interface state density portion of the dielectric layer and the JTE implant region.

6. The apparatus of claim 1, wherein the low interface state density portion includes a low interface-state density oxide.

7. The apparatus of claim 1, wherein the low interface state density portion is a deposited oxide of the dielectric layer at least partially converted to an oxynitride.

8. The apparatus of claim 1, wherein the low interface state density portion includes a phosphorus doped oxide.

9. The apparatus of claim 1, wherein the JTE implant region has a first portion with a depth below a doped region less than a depth of a second portion not below doped region.

10. The apparatus of claim 1, wherein the JTE implant region has a first top surface portion defining a first recess and a second top surface portion defining a second recess.

11. The apparatus of claim 1, wherein the JTE implant region defines a top surface of a plurality of recesses, the portion of the low interface state density portion is in contact with at least one of the plurality of recesses.

12. The apparatus of claim 1, wherein the JTE implant region is disposed in a termination region, the apparatus further comprising:

an active region including an active device.

13. The apparatus of claim 1, wherein the JTE implant region and the low interface state density portion being included in a termination region, the termination region configured to handle at least 50 milli-Joules of avalanche energy without failing.

14. A semiconductor device, comprising:

a semiconductor region including a silicon carbide material;

a JTE implant region disposed in a termination region of the semiconductor region;

a doped region having a least a portion disposed over the JTE implant region; and a low interface state density portion of a dielectric layer disposed over at least a portion of the doping region and over at least a portion of the JTE implant region.

15. The semiconductor device of claim 14, wherein the at least the portion of the JTE implant region is in contact with the low interface state density portion within a region recessed below a top surface of the semiconductor region.

16. The semiconductor device of claim 14, wherein the doped region having a bottom surface in contact with a top surface of the JTE implant region.

17. The semiconductor device of claim 14, further comprising:

a high interface state density portion dielectric layer disposed on the low interface state density portion such that a first portion of the low interface state density portion is disposed between the high interface state density portion and the doped region and a second portion of the low interface state density portion is disposed between the high interface state density portion and the JTE implant region.

18. The semiconductor device of claim 14, wherein the low interface state density portion includes at least one of a low interface-state density oxide, an oxynitride, or a phosphorus doped oxide.

19. The semiconductor device of claim 14, wherein the termination region includes a plurality of zones each defining a top surface at a different depth within the semiconductor device.

* * * * *

UNITED STATES PATENT AND TRADEMARK OFFICE

CERTIFICATE OF CORRECTION

PATENT NO. : 9,461,108 B2
APPLICATION NO. : 14/750655
DATED : October 4, 2016
INVENTOR(S) : Konstantinov It is certified that error appears in the above-identified patent and that said Letters Patent is hereby corrected as shown below:

In the Claims

In Column 16, Line 18, Claim 14, delete "a least" and insert -- at least --, therefor.

Signed and Sealed this
Sixth Day of June, 2017

Michelle K. Lee
*Director of the United States Patent and Trademark Office*